United States Patent [19]

Chae

[11] Patent Number: 5,403,755
[45] Date of Patent: Apr. 4, 1995

[54] METHOD FOR FABRICATING A THIN FILM TRANSISTOR

[75] Inventor: Gee S. Chae, Kyungki, Rep. of Korea

[73] Assignee: Goldstar Co., Ltd., Seoul, Rep. of Korea

[21] Appl. No.: 142,503

[22] Filed: Oct. 22, 1993

[30] Foreign Application Priority Data

Oct. 23, 1992 [KR] Rep. of Korea ............. 19541/1992

[51] Int. Cl.$^6$ ......................................... H01L 21/265
[52] U.S. Cl. ..................................... 437/21; 437/41; 437/909
[58] Field of Search ...................... 437/21, 41, 909

[56] References Cited

U.S. PATENT DOCUMENTS

| | | | |
|---|---|---|---|
| 5,120,667 | 6/1992 | Tarui et al. | 437/40 |
| 5,214,295 | 5/1993 | Manning | 257/67 |
| 5,254,488 | 10/1993 | Haller | 437/40 |
| 5,273,920 | 12/1993 | Kwansnick et al. | 437/40 |

*Primary Examiner*—Olik Chaudhuri
*Assistant Examiner*—Richard A. Booth
*Attorney, Agent, or Firm*—John P. White

[57] ABSTRACT

A method for fabricating a thin film transistor using a polysilicon with a double junction structure.

The method includes the steps of:
  forming a first insulation film, a semiconductor layer and a second insulation film on a transparent substrate, in this order;
  patterning the second insulation film and the semiconductor layer to remain only on a channel region;
  forming a first conductivity type of semiconductor layer having a low concentration and a first conductivity type of semiconductor layer having a high concentration on the whole surface, in this order, so that they are coupled to the remaining semiconductor layer;
  removing the first conductivity type of semiconductor layer having a low concentration and the first conductivity type of semiconductor layer having a high concentration which are located in the channel region selectively using the remaining second insulation film as an etch stopper, to define a source region and a drain region;
  removing the exposed portion of remaining second insulation film and then forming a gate insulation film on the whole surface;
  forming a gate electrode on the gate insulation film located over the channel region and the drain region; and
  forming a source electrode and a drain electrode, so that they are coupled to the source region and the drain region, respectively.

5 Claims, 3 Drawing Sheets

METHOD FOR FABRICATING A THIN FILM TRANSISTOR

BACKGROUND OF THE INVENTION

The present invention relates to a method for fabricating a semiconductor device, and more particularly to a method for fabricating a thin film transistor using a polysilicon with a double junction structure.

Thin film transistors have been widely employed as the switching device of liquid crystal displays(LCD).

For the high quality pictures and the high performance of liquid crystal display units, the high speed in the switching operation of thin film transistors(TFT) is required.

It is also required to properly meet the characteristics of thin film transistor such as ON current Ion, OFF current I off, threshold voltage $V_{th}$, electric field and mobility.

Hereinafter, a conventional method for fabricating a thin film transistor will be described with reference to the drawings.

FIGS. 1a to 1d are sectional views showing a conventional method for manufacturing a thin film transistor.

First, an insulation film 2 and a polysilicon 3 are formed on a transparent insulation substrate 1 in this order, as shown in FIG. 1a.

As shown in FIG. 1b, thereafter, a gate insulation film 5 is grown on the surface of polysilicon 3 and a polysilicon 6 is then deposited on the gate insulation film 5.

Subsequently, an unnecessary portion of the polysilicon 6 and the gate insulation film 5 is selectively removed using a photolithography process and an etching process to form a gate electrode 6a, as shown in FIG. 1c.

Thereafter, n-type ions having a high concentration are implanted into the polysilicon 3 located under both sides of the gate electrode 6a using the gate electrode 6a as a mask to form a source impurity region 4 and a drain impurity region 4a and further to complete a thin film transistor.

In accordance with a conventional thin film transistor fabricated as above mentioned, upon applying a voltage into the gate electrode 6a, a current start flowing according to the voltage difference between the source impurity region 4 and the drain impurity region 4a.

A channel is formed at the boundary of the polysilicon 3 and the gate insulation film 5 located between the source region 4 and the drain region 4a.

However, such conventional thin film transistor uses a polysilicon as the material of channel layer.

A problem may occur due to the characteristic of polysilicon film quality such as defect elements in polysilicon itself, electric fields at junction regions and results related to these. That is, since a leakage current starts flowing between the source impurity region and the drain impurity region although the gate electrode is turned off, there is a disadvantage in which the picture quality becomes inferior, when thin film transistors are used as switching devices of liquid crystal display units.

SUMMARY OF THE INVENTION

It is an object of the present invention to provide a method for fabricating a thin film transistor which is capable of minimizing the leakage current and also achieving the high quality of picture in liquid crystal display units.

To achieve this object of the present invention, there is provided a method for fabricating a thin film transistor comprising the steps of:

forming a first insulation film, a semiconductor layer and a second insulation film on a transparent substrate, in this order;

patterning the second insulation film and the semiconductor layer to remain only on a channel region;

forming a first conductivity type of semiconductor layer having a low concentration and a first conductivity type of semiconductor layer having a high concentration on the whole surface, in this order, so that they are connected to the remaining semiconductor layer;

removing the first conductivity type of semiconductor layer having a low concentration and the first conductivity type of semiconductor layer having a high concentration which are located in the channel region selectively using the remaining second insulation film as an etch stopper, to define a source region and a drain region;

removing the exposed portion of the remaining second insulation film and then forming a gate insulation film on the whole surface;

forming a gate electrode on the gate insulation film located over the channel region and the drain region; and forming a source electrode and a drain electrode, so that they are coupled to the source region and the drain region, respectively.

BRIEF DESCRIPTION OF THE DRAWINGS

The features and advantages of the present invention will be more clearly appreciated from the following description of the preferred embodiments of the invention taken in conjunction with the accompanying drawings in which.

DETAILED DESCRIPTION OF THE PREFERRED EMBODIMENT

Hereinafter, a method for fabricating a thin film transistor according to the present invention will be described in more detail with reference to accompanied FIGS. 2a to 2g.

FIGS. 2a to 2g are cross sectional views showing a method for fabricating a thin film transistor in accordance with an embodiment of the present invention.

Figure 1A:
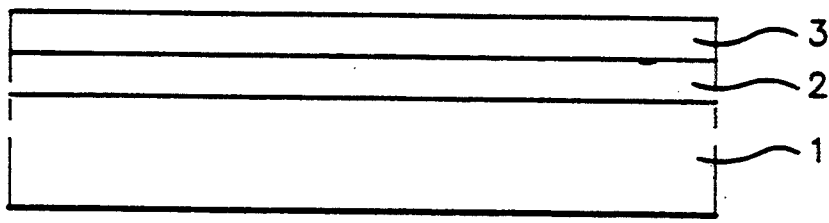
FIGS. 1a to 1d are cross sectional views illustrating a conventional method for fabricating a thin film transistor.
Figure 1B:
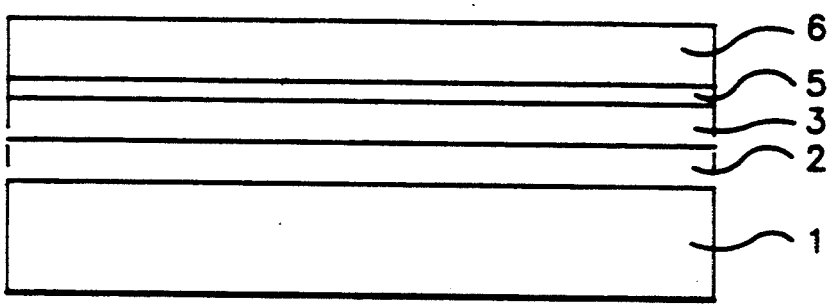
Figure 1C:
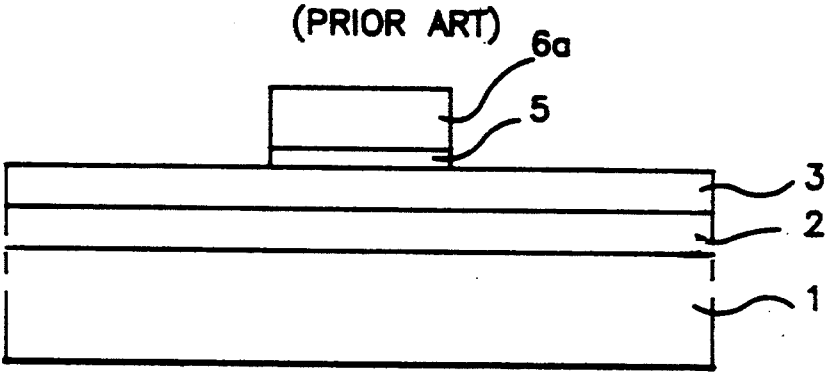
Figure 1D:
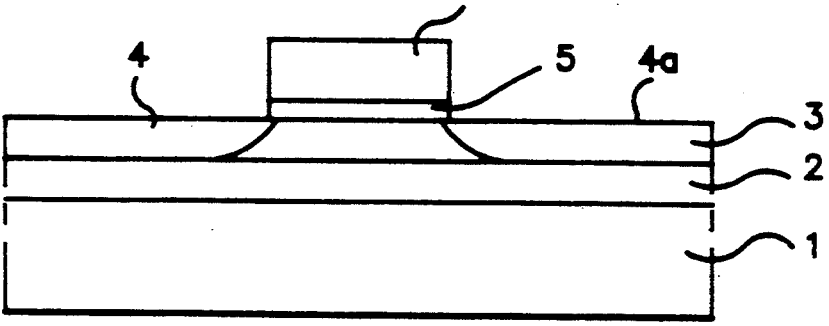
Figure 2A:
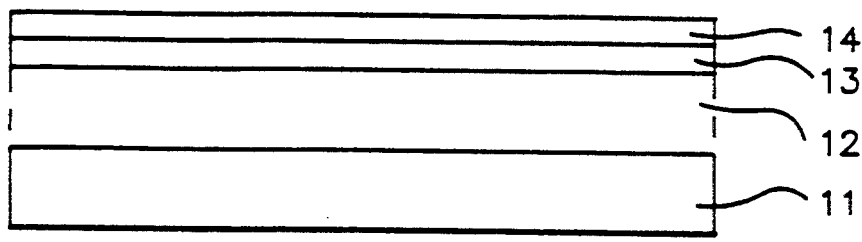
FIGS. 2a to 2g are cross sectional views illustrating a method for fabricating a thin film transistor in accordance with the present invention.

As shown in FIG. 2a, first, a first insulation film 12, a semiconductor layer 13 such as polysilicon or the like and a second insulation film 14 for etch stopper are formed successively on a transparent substrate 11, in this order.

Figure 2B:
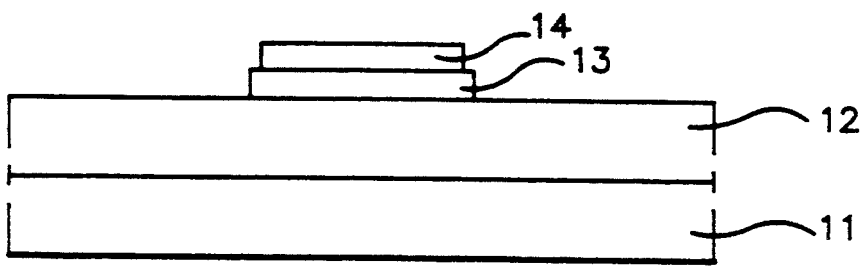

As shown in FIG. 2b, thereafter, a channel region is defined using a photolithography process and an etch process and then the second insulation film 14 and the semiconductor layer 13 are patterned to remove the unnecessary portion, thereby to remain only at the channel region.

At this time, the second insulation film 14 located on both edges of the semiconductor layer 13 is removed such that the width of second insulation film 14 becomes narrower than that of semiconductor layer 13.

Figure 2C:
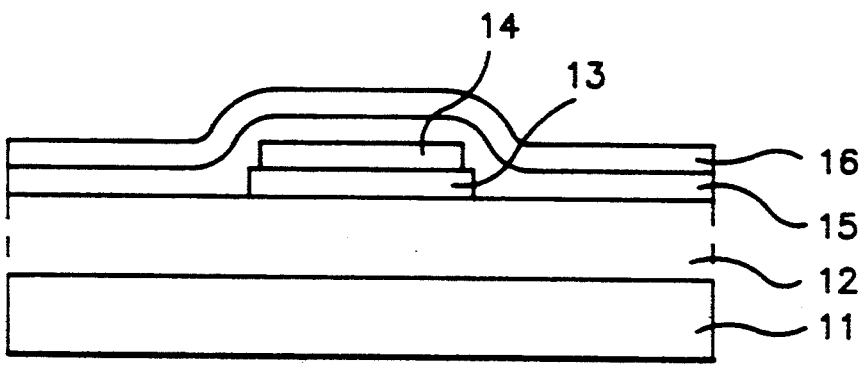

As shown in FIG. 2c, subsequently, n conductivity type of a semiconductor layer 15 having a low concentration($1 \times 10^{12} - 1 \times 10^{13}$/cm$^2$) and n conductivity type of semiconductor layer 16 having a high concentration($5 \times 10^{14} - 5 \times 10^{15}$/cm$^2$) are deposited on the whole surface, in this order, to form a source region and a drain region respectively.

Figure 2D:
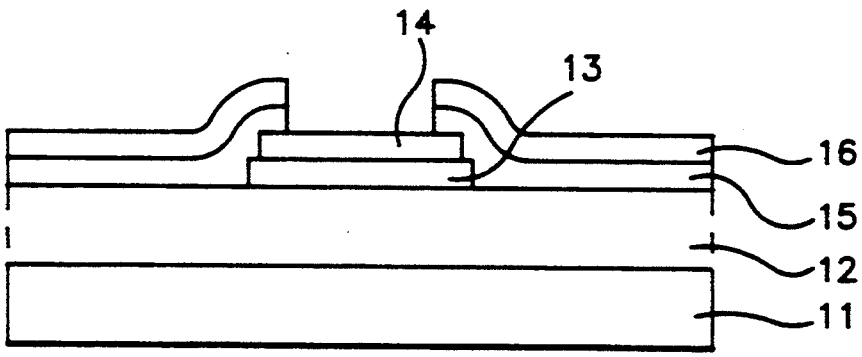

As shown in FIG. 2d, the n-conductivity type of semiconductor layer 15 having a low concentration and the n conductivity type of semiconductor layer 16 having a high concentration located on the remaining second insulation film 14 are selectively removed using the remaining second insulation film 14 as an etch stopper.

Herein, the n conductivity type of semiconductor layer 15 having a low concentration and the n conductivity type of semiconductor layer 16 having a high concentration can be made of polysilicon.

Figure 2E:
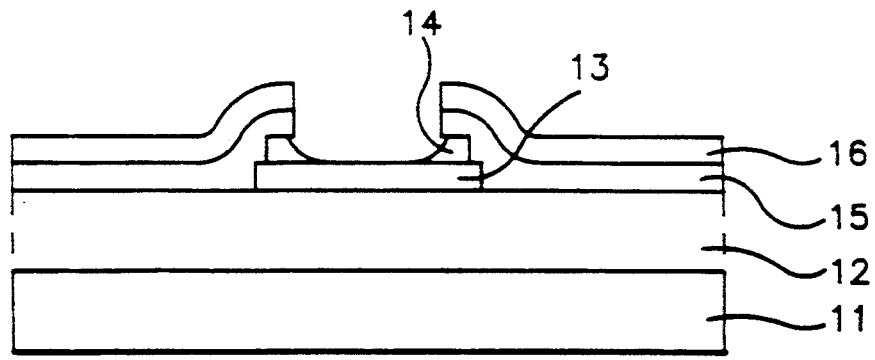

As shown in FIG. 2e, subsequently, the exposed portion of the second insulation film 14 is completely removed by use of a wet etching method using the n conductivity type of semiconductor layer 16 as a mask.

Figure 2F:
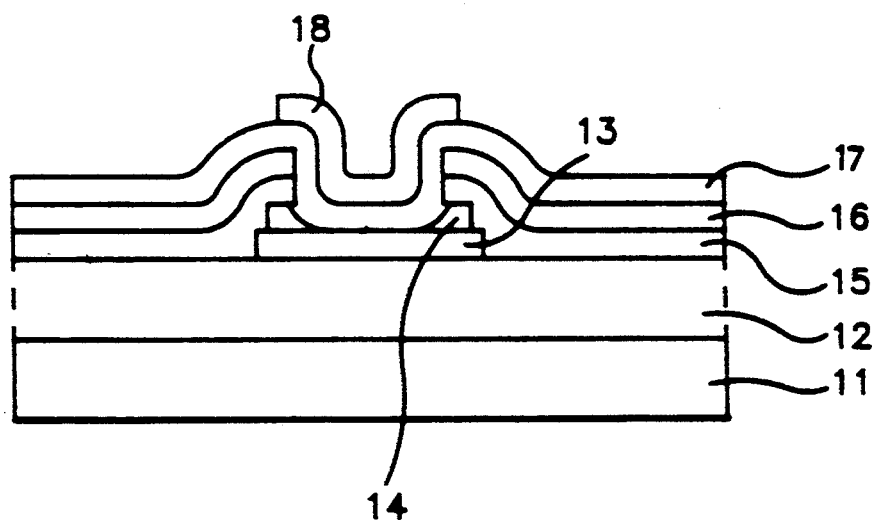

As shown in FIG. 2f, a gate insulation film 17 is formed on the whole surface and then a gate electrode 18 is formed on the gate insulation film 17.

Figure 2G:
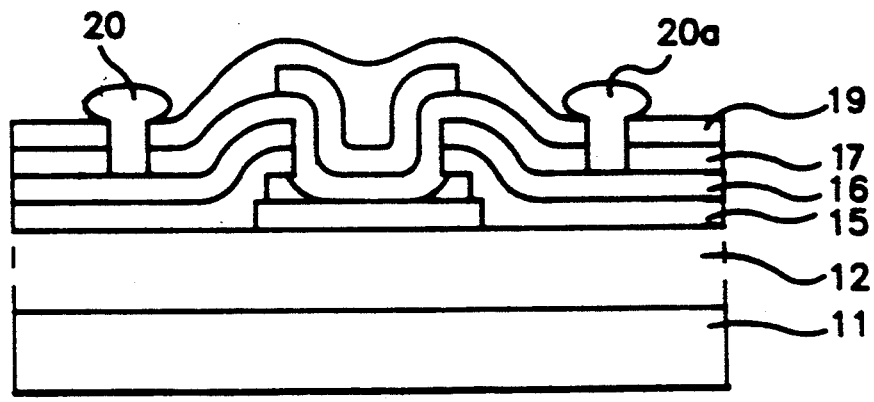

As shown in FIG. 2g, subsequently, a protection film 19 is formed on the whole surface of substrate and then the protection film 19 and the gate insulation film 17 are then removed selectively at a portion which is located over the n conductivity type of semiconductor layer 16, to form a contact hole for source electrode and a contact hole for drain electrode.

Thereafter, a metal is deposited so that it is connected to the n conductivity type of semiconductor 16 having a high concentration and then patterned to form a source electrode 20 and a drain electrode 20a.

The operation of thin film transistor fabricated according to this invention is same as that of conventional thin film transistor.

However, since n conductivity type of semiconductor layer 15 having a low concentration is formed between the semiconductor layer which is used as the channel region and the n conductivity type of semiconductor layer 16 having a high concentration which is used as the drain region and the source region, the difference in electric field can be reduced, thereby enabling the leakage current to be minimized. Moreover, the characteristic of "ON" and "OFF" current in the thin film transistor is improved. There is an advantage in that the high quality picture and the high performance of liquid crystal display units can be achieved, when applying thin film transistors as into liquid crystal display units.

What is claimed is:

1. A method for fabricating a thin film transistor comprising the steps of:
    forming a first insulation film, a semiconductor layer and a second insulation film on a transparent substrate, in this order;
    patterning said second insulation film and said semiconductor layer so said second insulation film and said semiconductor layer remain on a channel region;
    forming a first conductivity type of semiconductor layer having a low concentration and a first conductivity type of semiconductor layer having a high concentration on the whole surface, in this order, connected to said remaining semiconductor layer;
    removing said first conductivity type of semiconductor layer having said low concentration and said first conductivity type of semiconductor layer having said high concentration which are located in said channel region selectively using said remaining second insulation film as an etch stopper, to define a source region and a drain region;
    removing the exposed portion of said remaining second insulation film and then forming a gate insulation film on the whole surface;
    forming a gate electrode on said gate insulation film located over said channel region; and
    forming a source electrode and a drain electrode coupled to said source region and said drain region, respectively.

2. A method in accordance with claim 1, wherein said semiconductor layer, said first conductivity type of semiconductor layer having said low concentration and said first conductivity type of semiconductor layer having said high concentration are made of polysilicon.

3. A method in accordance with claim 1, wherein the impurity concentration of said first conductivity type of semiconductor layer having said low concentration is from $1 \times 10^{12}$/cm$^2$ to $1 \times 10^{13}$/cm$^2$.

4. A method in accordance with claim 1, wherein the impurity concentration of said first conductivity type of semiconductor layer having said high concentration is from $5 \times 10^{14}$/cm$^2$ to $5 \times 10^{15}$/cm$^2$.

5. A method in accordance with claim 1, wherein the patterning step is performed such that the width of said second insulation film is narrower than that of said semiconductor layer.

* * * * *